United States Patent [19]

Miyashita et al.

[11] Patent Number: 5,039,388

[45] Date of Patent: Aug. 13, 1991

[54] PLASMA FORMING ELECTRODE AND METHOD OF USING THE SAME

[75] Inventors: Teruo Miyashita, Shizuoka; Koichi Ito, Tokyo, both of Japan

[73] Assignees: Nippon Light Metal Company, Limited, a part interest; Applied Materials, Inc., both of Tokyo, Japan; a part interest

[21] Appl. No.: 477,726

[22] Filed: Feb. 9, 1990

[51] Int. Cl.$^5$ .................. B01J 19/12; H01H 1/46; C23F 4/04
[52] U.S. Cl. .................. 204/192.32; 156/345; 156/643; 118/723; 204/298.31
[58] Field of Search .................. 204/192.32, 298.31, 204/58; 156/345, 643; 118/723; 428/629, 654

[56] References Cited

U.S. PATENT DOCUMENTS

| | | | |
|---|---|---|---|
| 4,419,201 | 12/1983 | Levinstein et al. | 204/192.34 |
| 4,491,496 | 1/1985 | Laporte et al. | 156/345 |
| 4,507,179 | 3/1985 | Yoshida et al. | 204/58 |
| 4,540,449 | 9/1985 | Yoshida et al. | 148/31.5 |
| 4,939,044 | 7/1990 | Ohashi et al. | 428/654 |

*Primary Examiner*—Aaron Weisstuch
*Attorney, Agent, or Firm*—William J. Daniel

[57] ABSTRACT

A plasma forming electrode used in pairs disposed in mutually facing spaced parallel relation in a reduced pressure treating chamber, and between which a radio frequency current power is applied to produce a plasma, is formed from preferably highly pure aluminum or an aluminum alloy, and has a chromic acid anodic surface film layer thereon. It has greatly improved durability when used for plasma treatment in the presence of fluorine containing gas.

8 Claims, No Drawings

PLASMA FORMING ELECTRODE AND METHOD OF USING THE SAME

BACKGROUND OF THE INVENTION

1. Field of the Invention:

This invention relates to a plasma forming electrode used in an apparatus for high frequency plasma treatment, such as the formation of a film by plasma enhanced chemical vapor deposition (CVD) on the surface of a material, e.g. a semiconductor device, or for the subsequent plasma or reactive ion etching of the material surface.

2. Description of the Prior Art:

High frequency plasma treatment is a dry surface treatment which is carried out at a reduced pressure for various applications including the formation of a film on the surface of a material by plasma enhanced CVD, and the plasma etching or reactive ion etching (RIE) of the material surface. The treatment is carried out in an apparatus having a reduced pressure treating chamber provided with plasma forming electrodes. The material to be treated is positioned between the electrodes, and reactant or etching gases are supplied to form therebetween a high frequency plasma for performing the intended treatment.

The electrodes usually consist of an assembly of parallel flat electrodes. There are two types of assemblies used for different purposes. One of them is an assembly of the single substrate type and is used for processing a single substrate at a time. It comprises a pair of vertically spaced apart electrodes between which a high frequency plasma is produced to treat the material supported on the lower electrode. The other is a batch type of assembly which is used for the simultaneous processing of a plurality of substrates. It comprises a plurality of pairs of electrodes depending on the number of the substrates to be treated. This invention pertains to both of these two types of electrode assemblies.

The electrodes are made of aluminum, as described in, for example, Japanese Patent Application laid open under No. 56415/1986. There is also known an aluminum electrode having a surface layer formed by anodic oxidation in a bath containing sulfuric acid to ensure the production of a stable plasma, as described in, for example, "Solid State Technology, Japanese Edition", March, 1983, page 64, or Japanese Patent Application laid open under No. 58920/1988. Each electrode is in the shape of a disk having a diameter of, say, 130 to 200 mm and a thickness of, say, 2 to 10 mm.

Such apparatus are used for forming by plasma enhanced CVD an insulating film of silicon dioxide ($SiO_2$), silicon nitride ($Si_3N_4$), etc. on a substrate made of a single crystal of silicon (silicon wafer), or an amorphous silicon film on a substrate. A silicon dioxide ($SiO_2$) film is usually deposited from a mixture of TEOS (tetraethyl orthosilicate) and oxygen ($O_2$) gases, and a silicon nitride ($Si_3N_4$) film from a mixture of monosilane ($SiH_4$) gas with ammonia ($NH_3$) or nitrogen ($N_2$) gas. The gases are supplied into a treating chamber having a vacuum present of, say, 15 to 20 torr and an electric current having a high frequency of, for example, 13.56 MHz is applied to produce a plasma between the electrodes. The gases react and deposit a reaction product forming an insulating film on a silicon wafer heated in the range of 300° to 400° C.

The reaction product, such as silicon dioxide or nitride, is, however, deposited also on the electrodes, the wall surfaces of the treating chamber, etc., although only in a small amount. Even so, the deposition of the reaction product on the electrodes, especially the upper electrode, among others, exerts a serious effect on the efficiency of treatment, as it prevents the formation of a stable plasma and thereby lowers the yield of films having good quality.

The treating chamber is, therefore, cleaned before each cycle of treatment is started. There is known a cleaning method which employs a nitric acid bath to remove the deposit by etching. This method, however, also seriously etches the aluminum electrodes and causes a heavy consumption thereof. Accordingly, there is also known a dry cleaning method which employs a fluorine containing gas, such as $CF_4$, $C_2F_6$, $C_3F_8$ or $NF_3$ gas, for etching away the deposit. This method is widely adopted, it can keep the electrode consumption at a relatively low level and moreover enables the cleaning of the apparatus in situ. The dry cleaning of a treating chamber is carried out by supplying it with etching gas and igniting a high frequency plasma discharge. The reaction product which has been deposited on various portions of the chamber is converted to low boiling point fluoride compounds by the chemical reaction of the resulting radicals and the sputtering effect of ions, and the fluoride is removed by vaporization from their surfaces.

The plasma or reactive ion etching treatment is employed for a variety of purposes in a semiconductor manufacturing process including the formation of a circuit and a dopling layer. For example, a high frequency plasma discharge in the presence of $CF_4$, $CHF_3$, $C_2F_6$, $NF_3$, $SiF_4$, $SF_6$ or other fluorine containing gas under a low pressure in the order of about 0.01 to several torr is employed for the radical or reactive ion etching into a predetermined shape of not only the silicon of a silicon wafer, but also an ininsulating film of silicon dioxide or nitride formed thereon. The high frequency plasma treatment in the presence of a fluorine containing gas is repeated for any such purpose as has hereinabove been stated.

However, aluminum electrodes having a surface layer formed by anodic oxidation in a bath containing sulfuric acid which are widely used in apparatus for high frequency plasma treatment suffer a heavy reduction in layer thickness due to corrosion during the treatment. Therefore, the development of an aluminum electrode having an anodized surface layer of high durability has been eagerly awaited.

SUMMARY OF THE INVENTION

We, the inventors of this invention, have explored the possible cause for the reduction in thickness of such an anodized layer. As a result, we have found that the sulfate group in an anodizing bath is incorporated into an anodized layer, and that the vaporization of its sulfur (S) component by reaction with the active fluorine in etching gas causes the breakdown of the anodized layer leading to a reduction of its thickness. Our further studies have taught us that an anodized layer formed by employing a chromate bath is barely corroded by active fluorine, but is durable for a long period of time without having any substantial reduction in thickness, as opposed to the conventional layer formed by employing a sulfate bath.

This invention, thus, provides a plasma forming electrode used to define an assembly consisting of at least one pair of electrodes which are disposed in mutually facing spaced parallel relation in a reduced pressure treating chamber, and between which a high frequency current is applied to produce a plasma, each electrode comprising aluminum or an aluminum alloy having a chromic acid anodic film.

The anodized layer formed in a chromate bath not only contributes to the production of a stable plasma, but also is highly resistant to corrosion by active fluorine gas. Such corrosion leads to a reduction in thickness during the formation of a film of silicon dioxide or nitride, etc. on a wafer, during plasma etching of its surface, or during cleaning of the electrodes, wall surfaces, etc. of the treating chamber for removing deposited reaction product therefrom. As it does not undergo a substantial reduction in its thickness, the layer contains few particles that would contaminate a silicon dioxide or nitride film, or hinder its satisfactory etching. Moreover, the layer is sufficiently resistant to heat that it does not crack at a temperature of 300° to 400° C. prevailing during the plasma treatment, but is able to maintain a stable plasma throughout the treatment.

The electrode of this invention exhibits greatly improved durability when used for plasma treatment in the presence of fluorine containing gas, and thereby contributes to greatly improved productivity, economy, and quality reliability of plasma enhanced CVD, and plasma or reactive ion etching.

DETAILED DESCRIPTION OF THE INVENTION

The electrode of this invention is formed from aluminum or an aluminum alloy. More specifically, it is formed from a material selected from aluminum having a purity of at least 99.0% by weight, or preferably at least 99.99% by weight, and aluminum alloys based on such aluminum, including JIS 1050, 1100, 3003, 5052, 5083 and 6061 alloys as specified by JIS (Japanese Industrial Standards), or similar alloys developed by individual companies, such as Ag-Mg alloys containing 2 to 6% by weight of magnesium.

Particles composed of, for example, metallic silicon or an intermetallic compound such as $\beta$-AlFeSi, $TiAl_3$ or $MnAl_6$, are likely to form by crystallization or precipitation during the manufacture of the material. As these particles are difficult to anodize, the base material used for making the electrode of this invention should not contain any such particles having a diameter exceeding two microns. If larger particles are present on the surface of the material, they form electrode regions which are difficult to anodize, and in which the plasma current tends to be eventually concentrated, resulting in a non-uniform plasma.

The electrodes of this invention are preferably formed from aluminum having a purity of at least 99.99% by weight and free of more than 30 ppm of iron. A continuous casting process of the water cooling type, the Hunter process of Hunter Engineering Co., the belt caster process of Hazellet, etc. are preferably employed for preparing an electrode material not containing undesirable large particles which are difficult to anodize. It is effective to form a solid solution by controlling the conditions of heat treatment which is employed when a plate is made.

An anodized layer has a longer life as its thickness increases. A thicker layer is, however, more likely to crack when exposed to heat. Therefore, it is appropriate to form a layer having a thickness not exceeding about 20 microns. A layer thickness of 5 to 15 microns is preferred.

An anodized layer may be formed by a constant current or voltage process which is usually employed for anodic oxidation in a chromic acid bath. The constant voltage process is preferable from the standpoint of operational stability. An anodized layer may be formed by anodizing the electrode material in a bath principally containing 10 to 100 g of chromium trioxide (as chromic anhydride, $CrO_3$) per liter, and having a temperature of 20° to 50° C., using a constant DC voltage of 40 to 100 V and an electrolysis time of 30 to 180 minutes.

The anodizing treatment is preceded by a pretreatment including the customary degreasing by sodium hydroxide or silicate, or an organic solvent, and is followed by water washing, air drying and firing. No sealing treatment is necessary. Heat treatment of the anodized layer is carried out for dehydration and stabilization and thereby facilitating the evacuation of the apparatus for plasma treatment. Its firing is performed by heating in a drying oven, or the like at a temperature of 250° to 370° C. for a time of 20 to 120 minutes. After the anodized layer has been fired, the electrode is preferably stored in a vacuum package formed from e.g. a plastic film and having a pressure of, say, 0.1 torr until it is opened immediately before the electrode is placed in use.

The invention will now be described more specifically with reference to a number of examples directed to electrodes used for plasma enhanced CVD. It will be understood that the following description is not intended to limit the scope of this invention.

The thickness of the anodized layer on each electrode was determined by cutting a small sample from the layer, embedding it in resin, polishing its surface to a mirror finish for easy observation, taking a photograph of 800 magnifications of its surface through an optical microscope, measuring the thickness of the layer at 10 separate points on the photograph, and calculating the average of these 10 measurements.

EXAMPLE 1

Disks each having a diameter of 140 mm and a thickness of 3 mm were formed from the aluminum alloy JIS 6061 (corresponding to AA6061). They were subjected to five minutes of pretreatment with a 5% aqueous solution of sodium hydroxide at 50° C., and rinsed with water. Then, they were anodized in an electrolytic bath containing 25 g of chromium oxide, $CrO_3$, per liter and having a temperature of 40° C., by applying a direct current having a constant voltage of 70 v and using a stainless steel cathode, for different periods of time so that pairs of electrodes having four different anodized layer thicknesses were prepared. They were washed with water, dried by air, and heat treated at 350° C. for two hours.

Each pair of electrodes having the same anodized layer thickness was employed as upper and lower electrode, respectively, in an apparatus of the single substrate processing type for radio frequency (RF) plasma treatment conducted at a frequency of 13.56 MHz. The apparatus was operated alternately for the formation of a film of $SiO_2$ from a reaction gas consisting of a mixture of tetraethyl orthosilicate and oxygen in a chamber evacuated of 10 torr, using an RF power of 3 W per $cm^2$ of electrode area and a deposition time of two minutes, and for dry cleaning for two minutes by plasma enhanced cleaning gas consisting of a mixture of nitrogen fluoride, NF$_3$, and oxygen and an RF power of 4 W per cm$^2$ of the electrode area.

The apparatus was operated for 1000 cycles of SiO$_2$ film deposition and dry cleaning. Then, the anodized layers of the upper electrode were examined for any thickness reduction. The results are shown in a table below.

TABLE

| Anodized layer thickness (microns) | | | |
|---|---|---|---|
| Initial | After 1000 cycles | Reduction | Remarks |
| 7.8 | 6.3 | 1.5 | Within the scope of of this invention |
| 11.8 | 10.5 | 1.3 | Within the scope of of this invention |
| 16.3 | 14.9 | 1.4 | Within the scope of of this invention |
| 22.2 | Cracked | — | Outside the scope of this invention |

As is obvious from the table, all of the anodized layers having a thickness smaller than 20 microns showed only a small reduction in thickness. The greatly improved durability of the anodized layer according to this invention will be obvious from a comparison of these results with those of the comparative example which will hereinafter be described.

COMPARATIVE EXAMPLE

Disks of the same aluminum alloy as in EXAMPLE 1 were subjected to 13 minutes of anodic oxidation in a bath containing 150 g of sulfuric acid per liter at a temperature of 13° C. by a constant current process employing an anode current density of 3 A/dm$^2$, whereby anodized layers having a thickness of 11.9 microns were formed. They were rinsed with water, dried by air, and heat-treated at 200° C. for two hours. Then, the procedures of EXAMPLE 1 were followed for alternate SiO$_2$ film formation and dry cleaning. When 700 cycles had been finished, however, bright spots began to appear due to concentration of the plasma on limited regions of the electrodes, and the test was, therefore, discontinued. The following results were obtained:

Initial layer thickness: 11.9 microns
Thickness after 700 cycles: 5.3 microns
Reduction: 6.6 microns An attempt was made to prepare electrodes by using a heat treatment temperature of 350° C., but resulted in cracking of the anodized layers. No repetition test was, therefore, conducted on such electrodes.

EXAMPLE 2

The procedures of EXAMPLE 1 were followed for anodizing disks of the aluminum alloy JIS 6061 (corresponding to AA 6061) and an aluminum-magnesium alloy obtained by melting aluminum of 99.997% by weight purity and 4.0% by weight of magnesium and containing 20 ppm of each of iron and silicon having a maximum particle diameter not exceeding 1.5 microns, whereby electrodes each having an anodized layer thickness of 15 microns were prepared. The procedures of EXAMPLE 1 were followed for conducting a cycle test consisting of alternate SiO$_2$ film deposition and dry cleaning. The test was continued until a uniform plasma ceased to form. The electrodes which had been formed from the 6061 alloy could not be used for more than 6500 cycles, but those formed from the Al-Mg alloy could be used for as many as 9300 cycles. The layer life in the latter products was apparently due to the smaller size and amount of non-anodized particles in the alloy and thus a more consistent anodized film on the alloy surface.

Moreover, both of the tests confirmed that the anodized layers according to this invention gave a smaller degree of particle contamination to the materials to be treated than the conventional anodized layers formed in a sulfuric acid bath.

What is claimed is:

1. In a plasma apparatus comprising plasma forming electrodes used in pairs disposed in mutually facing spaced parallel relation in a reduced pressure treating chamber, and between which a radio frequency current is applied to produce a plasma, the improvement wherein said electrodes each comprise a base selected from aluminum or an aluminum alloy and on said base a chromic acid anodic surface film layer having a thickness not in excess of about 20 microns.

2. An apparatus as set forth in claim 1, wherein said layer has a thickness of 5 to 15 microns.

3. An apparatus as set forth in claim 1, wherein said material is highly pure aluminum having a purity of at least 99.99% by weight or an aluminum alloy produced from said highly pure aluminum, and contains difficultly anodizable particles having a diameter not exceeding two microns.

4. A method of forming a plasma which comprises applying a plasma-forming radio frequency current under a reduced pressure between a mutually facing spaced parallel pair of electrodes wherein said electrodes each comprises a base of aluminum or an aluminum alloy and on said base a chromic acid anodic surface film layer having a thickness not in excess of about 20 microns.

5. The method of claim 4 wherein said surface film layer has a thickness of about 5–15 microns.

6. A plasma forming electrode for a plasma-forming apparatus wherein two of said electrodes are arranged in mutually facing spaced parallel relation, said electrode comprising a base of aluminum or aluminum alloy and on said base a chromic acid anodic surface layer having a thickness not in excess of about 20 microns.

7. The electrode of claim 6 wherein said anodic surface layer has a thickness of about 5–15 microns.

8. The electrode of claim 6 wherein said base is in the shape of a flat disc.

* * * * *